(12) United States Patent
Matsuura et al.

(10) Patent No.: US 10,283,728 B2
(45) Date of Patent: May 7, 2019

(54) ELECTROLYTIC COPPER FOIL AND MANUFACTURING METHOD THEREFOR

(71) Applicant: MITSUI MINING & SMELTING CO., LTD., Tokyo (JP)

(72) Inventors: Yoshinori Matsuura, Saitama (JP); Toshimi Nakamura, Saitama (JP); Masaharu Myoi, Saitama (JP); Hajime Watanabe, Saitama (JP)

(73) Assignee: MITSUI MINING & SMELTING CO., LTD., Tokyo (JP)

(*) Notice: Subject to any disclaimer, the term of this patent is extended or adjusted under 35 U.S.C. 154(b) by 298 days.

(21) Appl. No.: 15/032,784

(22) PCT Filed: Jun. 4, 2014

(86) PCT No.: PCT/JP2014/064806
§ 371 (c)(1),
(2) Date: Apr. 28, 2016

(87) PCT Pub. No.: WO2015/087566
PCT Pub. Date: Jun. 18, 2015

(65) Prior Publication Data
US 2016/0285030 A1 Sep. 29, 2016

(30) Foreign Application Priority Data
Dec. 13, 2013 (JP) ................. 2013-258566

(51) Int. Cl.
*H01L 51/52* (2006.01)
*H05B 33/10* (2006.01)
(Continued)

(52) U.S. Cl.
CPC ......... *H01L 51/5203* (2013.01); *H01B 1/026* (2013.01); *H01L 51/0096* (2013.01);
(Continued)

(58) Field of Classification Search
CPC ... H01L 51/5203; H01L 51/56; H01L 21/288; H01L 21/445; H05K 1/09; H05K 3/385
See application file for complete search history.

(56) References Cited

U.S. PATENT DOCUMENTS 4,661,417 A * 4/1987 Suzuki ............. H05K 3/385
428/607
9,899,683 B2 * 2/2018 Lee ................. H01M 4/661
(Continued)

FOREIGN PATENT DOCUMENTS

JP 2005-076091 A 3/2005
JP 2008-243772 A 10/2008
(Continued)

OTHER PUBLICATIONS

International Search Report issued with respect to application No. PCT/JP2014/064806, dated Jul. 8, 2014.
(Continued)

*Primary Examiner* — Benjamin P Sandvik
(74) *Attorney, Agent, or Firm* — Greenblum & Bernstein, P.L.C.

(57) ABSTRACT

There is provided a high gloss electrodeposited copper foil which can be manufactured in a short time. The electrodeposited copper foil has a fraction of the areas occupied by the {100} plane deviating by 18° or less from the <001> crystal orientation of 10% or more determined by analysis of the surface by electron backscatter diffraction (EBSD) and at least one surface of the electrodeposited copper foil has a glossiness $G_s$ (20°) of 1,500 or more, determined in accordance with JIS Z 8741-1997.

6 Claims, 7 Drawing Sheets

(51) Int. Cl.
*H05B 33/26* (2006.01)
*H01B 1/02* (2006.01)
*H01L 51/00* (2006.01)
*H01L 51/44* (2006.01)
*H01L 51/56* (2006.01)
*H01L 21/445* (2006.01)
*H01L 21/288* (2006.01)

(52) U.S. Cl.
CPC ........ *H01L 51/441* (2013.01); *H01L 51/5218* (2013.01); *H01L 51/5231* (2013.01); *H01L 51/56* (2013.01); *H05B 33/10* (2013.01); *H05B 33/26* (2013.01); *H01L 21/288* (2013.01); *H01L 21/445* (2013.01); *Y02E 10/549* (2013.01); *Y02P 70/521* (2015.11)

(56) References Cited

U.S. PATENT DOCUMENTS

| | | | |
|---|---|---|---|
| 2005/0048306 A1 | 3/2005 | Suzuki et al. | |
| 2009/0017335 A1 | 1/2009 | Takai | |
| 2010/0038115 A1 | 2/2010 | Matsuda et al. | |
| 2011/0132643 A1* | 6/2011 | Hattori | H05K 1/09 174/254 |
| 2013/0048976 A1 | 2/2013 | Matsuura et al. | |
| 2014/0048791 A1 | 2/2014 | Matsuura et al. | |
| 2015/0056466 A1* | 2/2015 | Kato | C23C 28/021 428/647 |
| 2015/0114551 A1* | 4/2015 | Moritz | B44C 1/14 156/233 |
| 2017/0018329 A1* | 1/2017 | Matsuo | H01B 1/026 |

FOREIGN PATENT DOCUMENTS

| | | |
|---|---|---|
| JP | 2009-020920 A | 1/2009 |
| JP | 2009-152113 A | 7/2009 |
| JP | 2009-185384 A | 8/2009 |
| JP | 2009-231309 A | 10/2009 |
| JP | 2011-222819 A | 11/2011 |
| JP | 2013-147755 A | 8/2013 |
| WO | 2006/106956 A1 | 10/2006 |
| WO | 2011/152091 A1 | 12/2011 |
| WO | 2011/152092 A1 | 12/2011 |
| WO | 2013/002275 A1 | 1/2013 |

OTHER PUBLICATIONS

International Preliminary Report on Patentability issued with respect to application No. PCT/JP2014/064806, dated Jun. 14, 2016, and Written Opinion dated Jul. 8, 2014.

* cited by examiner

ELECTROLYTIC COPPER FOIL AND MANUFACTURING METHOD THEREFOR

TECHNICAL FIELD

The present invention relates to an electrodeposited copper foil and a method of manufacturing the electrodeposited copper foil.

BACKGROUND ART

Light-emitting elements such as organic EL lighting devices have recently attracted attention as eco-friendly green devices. The organic EL lighting devices are characterized by 1) lower power consumption than incandescent lamps; 2) thin profile and light weight; and 3) flexibility. The organic EL lighting devices are now being developed to achieve the features 2) and 3). In this respect, glass substrates conventionally used in flat panel displays (FPD) or the like cannot achieve the features 2) and 3).

In this regard, researches have been conducted on a substrate as a support (hereinafter, referred to as "supporting substrate") for organic EL lighting devices, and ultra-thin glass plates, resin films, metal foils or the like have been proposed as candidate supporting substrates. The ultra-thin glass is superior in thermal resistance, barrier performance, and optical transparency and has good flexibility, but is somewhat inferior in handleability and has low thermal conductivity and high material cost. The resin film is superior in handleability and flexibility and has low material cost and good optical transparency, but is inferior in thermal resistance and barrier performance and has low thermal conductivity.

In contrast, the metal foil has excellent characteristics such as superior thermal resistance, barrier performance, handleability, and thermal conductivity, good flexibility, and low material cost, except for absence of optical transparency. In particular, a typical flexible glass or film has a significantly low thermal conductivity of 1 W/m° C. or lower, while a copper foil has a significantly high thermal conductivity of about 400 W/m° C.

PTL 1 (JP2009-152113A) discloses formation of an organic layer on a surface of a metal substrate that is smoothed by polishing and/or plating in order to achieve a light-emitting element including the metal substrate. PTL 2 (JP2008-243772A) discloses formation of an organic EL element on a smooth surface of a nickel plating layer that is formed on a metal substrate without polishing or the like. Aside from these disclosures, photoelectric elements including metal substrates are also proposed; for example, PTL 3 (JP2011-222819A) discloses a solar cell with a thin organic electromotive layer provided on a smoothed metal substrate. In these techniques, however, the smoothing of the metal substrate is an important challenge for prevention of a short circuit between the electrodes. For addressing this challenge, PTL 4 (WO2011/152091) and PTL 5 (WO2011/152092) disclose metal foil having an ultra-smooth surface having an extremely low arithmetic mean roughness Ra of 10.0 nm or less that functions as both supporting substrates and electrodes.

A surface-treated electrodeposited copper foil is also known to be designed taking a glossiness $G_s$ (60°) into consideration in addition to the arithmetic average roughness Ra. For example, PTL 6 (JP2013-147755A) discloses a surface-treated electrodeposited copper foil having been subjected to at least one of rust-proof treatment and silane coupling agent treatment on its surface, wherein the surface of the surface-treated electrodeposited copper foil to be bonded to an insulation layer-constituting material has a surface roughness (Rzjis) of 0.1 μm to 1.0 μm, a glossiness [$G_s$ (60°)] of 400 or more, and a maximum peak to valley height (PV) of 0.05 μm to 1.5 μm.

CITATION LIST

Patent Literature

PTL 1: JP2009-152113A
PTL 2: JP2008-243772A
PTL 3: JP2011-222819A
PTL 4: WO2011/152091
PTL 5: WO2011/152092
PTL 6: JP2013-147755A

SUMMARY OF INVENTION

The inventors have found that chemical mechanical polishing (CMP) on a specific electrodeposited copper foil can provides a high gloss electrodeposited copper foil which can be manufactured in a short time, in which the fraction of the areas occupied by the {100} plane deviating by 18° or less from the <001> crystal orientation is 10% or more by analysis of the surface by electron backscatter diffraction (EBSD).

Accordingly, it is an object of the present invention to provide a high gloss electrodeposited copper foil which can be manufactured in a short time.

According to an embodiment of the present invention, there is provided an electrodeposited copper foil, in which a fraction of the areas occupied by the {100} plane deviating by 18° or less from the <001> crystal orientation is determined to be 10% or more by analysis of the surface by electron backscatter diffraction (EBSD), wherein at least one surface of the electrodeposited copper foil has a glossiness $G_s$ (20°) of 1,500 or more, as measured in accordance with JIS Z 8741-1997.

According to another embodiment of the present invention, there is provided an organic semiconductor device comprising an electrode foil including the electrodeposited copper foil, an organic semiconductor layer disposed on the surface of the electrode foil, and a counter electrode layer disposed on the organic semiconductor layer.

According to yet another embodiment of the present invention, there is provided a method of manufacturing an electrodeposited copper foil comprising the steps of providing an untreated electrodeposited copper foil, in which a fraction of the areas occupied by the {100} plane deviating by 18° or less from the <001> crystal orientation is determined to be 10% or more by analysis of the surface by electron backscatter diffraction (EBSD), and performing chemical mechanical polishing (CMP) on at least one of the surfaces of the untreated electrodeposited copper foil.

DESCRIPTION OF EMBODIMENT

Electrodeposited Copper Foil

The electrodeposited copper foil of the present invention and the untreated electrodeposited copper foil used in the present invention is an electrodeposited copper foil in which the fraction of the areas occupied by the {100} plane deviating by 18° or less from the <001> crystal orientation is determined to be 10% or more by analysis of the surface by electron backscatter diffraction (EBSD). The electron backscatter diffraction (hereinafter, referred to as EBSD) is a well-known technique which analyzes the crystal orientations and crystal structures of the local regions with an electron backscatter pattern (EBSP) that is generated when one point on the surface of the sample is irradiated with an electron beam in a scanning electron microscope (SEM).

The untreated electrodeposited copper foil refers to an electrodeposited copper foil before surface treatment such as chemical mechanical polishing (CMP), and typically refers to a copper foil as electrodeposited. The results obtained by analysis of the surface by EBSD are almost the same in both the untreated electrodeposited copper foil and the surface-treated electrodeposited copper foil.

Figure 1:
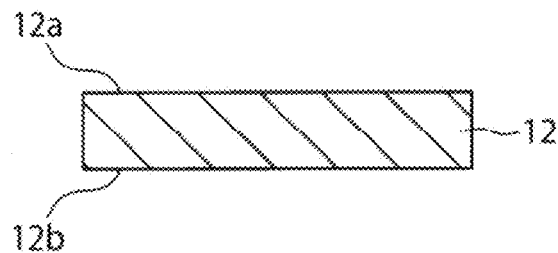
FIG. 1 is a schematic cross-sectional view illustrating an electrodeposited copper foil of the present invention.

FIG. 1 is a schematic cross-sectional view illustrating an electrodeposited copper foil of the present invention. The electrodeposited copper foil 12 depicted in FIG. 1 is made of copper or copper alloy, having a front surface 12a and a back surface 12b. At least one surface of the electrodeposited copper foil 12 (i.e., the front surface 12a and/or the back surface 12b ) has a high glossiness $G_s$ (20°) of preferably 1,500 or higher, more preferably 1,600 or more, still more preferably 1,650 or more. The glossiness $G_s$ (20°) is an index measured in accordance with JIS Z 8741-1997. The beam is directed at an incident angle of 20° to the surface of the electrodeposited copper foil and the intensity of the light reflected at a reflection angle of 20° was measured to determine the glossiness $G_s$ (20°). A glossiness $G_s$ (20°) of 1,500 or more is such a high level that the surface of the copper foil having the glossiness can be visually recognized as if it were a glossy mirror surfaces. Such a high glossiness has not been required for the conventional electrodeposited copper foils. Recently, however, attempts have been being made to use electrodeposited copper foils as electrodes for electronic devices such as light-emitting elements (refer to PTLs 4 and 5), and thus the specular high glossiness has been desired for the electrodeposited copper foils. The surface having such a high glossiness is extremely flat, so that the electrodeposited copper foil used as an electrode for an electronic device such as a light-emitting element and a photoelectric element can effectively prevent a short circuit between electrodes, allowing the copper foil to be usable for the electronic device as a supporting material and electrode. Furthermore, the high glossiness reduces the angle dependence of cavities and is advantageous for optical designing especially in the case of white emission because the effect of the high glossiness increases. Unfortunately, however, the time required for the surface treatment is prolonged if such a high glossiness is to be provided, leading to poor production efficiency. Although chemical mechanical polishing (CMP) is an effective technique for imparting a high glossiness to the electrodeposited copper foil, it takes processing time accordingly to provide such an extremely high glossiness $G_s$ (20°)of 1,500 or more. In particular, in the case of a roll-to-roll process involving continuous process of steps of the surface treatment of the electrodeposited copper foil and the subsequent element formation, time loss in the surface treatment step can be a factor inhibiting the realization of a continuous process.

Meanwhile, the electrodeposited copper foil of the present invention and the untreated electrodeposited copper foil used in the present invention has a fraction of the areas occupied by the {100} plane deviating by 18° or less from the <001> crystal orientation of 10% or more, preferably 15% or more, more preferably 20% or more, still more preferably 25% or more, even still more preferably 30% or more, particularly preferably 35% or more, most preferably 40% or more, determined by analysis of the surface by EBSD. Thus, a high fraction of the areas occupied by the {100} plane deviating by 18° or less from the <001> crystal orientation indicates that {100} planes of a large number of crystal grains are exposed on the surface of the copper foil, that is, a high proportion of the {100} planes are oriented on the copper foil surface. According to the recent findings of the present inventors, such {100} planes can be polished in a shorter time than other crystal planes, such as [111] planes, when subjected to the chemical mechanical polishing (CMP) process. Thus, a high glossiness can be provided in a short time according to the present invention. In other words, the present invention provides a high gloss electrodeposited copper foil which can be manufactured in a short time. Accordingly, the electrodeposited copper foil and the method of manufacturing the electrodeposited copper foil according to the present invention is highly suitable for the continuous process of the surface treatment of the electrodeposited copper foil and the subsequent element formation according to the roll to roll process. The roll-to-roll process is a significantly advantageous process in terms of efficient mass production of electric devices, in which a long foil is wound off a roll, subjected to a predetermined process and rewound; therefore the roll-to-roll process is a key process to achieve mass production of electronic devices such as a light-emitting element and a photoelectric element, which belong to the suitable application field of the electrodeposited copper foil of the present invention.

Accordingly, the electrodeposited copper foil can be preferably manufactured in such a manner that an untreated electrodeposited copper foil having a fraction of the areas occupied by the {100} plane deviating by 18° or less from the <001> crystal orientation of 10% or more, preferably 15% or more, more preferably 20% or more, still more preferably 25% or more, even still more preferably 30% or more, particularly preferably 35% or more, most preferably 40% or more, determined by analysis of the surface by EBSD is prepared and at least one of the surfaces of the untreated electrodeposited copper foil is subjected to chemical mechanical polishing (CMP). The thus CMP-processed surface has a high glossiness. The electrodeposited copper foils having a fraction of the areas occupied by the {100} plane deviating by 18° or less from the <001> crystal orientation within the above range, determined by analysis of the surface by EBSD, are commercially available, and can be manufactured by setting conditions of the electrolytic solution and electrodeposition as appropriate. Chemical mechanical polishing (CMP) is preferably performed such that at least one surface (i.e., the front surface $12a$ and/or the back surface $12b$) has a glossiness $G_s$ (20°) of 1,500 or more, more preferably 1,600 or more, still more preferably 1650 or more. The CMP process can be performed in a short time according to the present invention, and thus the CMP process is preferred to be performed continuously by a roll-to-roll process.

CMP process can be performed with a known polishing solution and a known polishing pad under known conditions. A preferred polishing solution comprises one or more granular polishing agents selected from ceria, silica, alumina, zirconia, and other materials in an amount of about 0.1 to about 10 wt %; a rust inhibitor such as benzotriazole (BTA); and/or an organic complexing agent such as quinaldic acid, quinolinic acid, nicotinic acid, malic acid, amino acids (e.g., glycine), citric acid, carboxylic acid, or poly (acrylic acid); a surfactant such as a cationic surfactant or an anionic surfactant; and optionally an anticorrosive agent. Furthermore, the polishing solution particularly preferably comprises hydrogen peroxide in addition to the amino acid based organic complexing agent such as glycine. In this case, the copper can be oxidized with hydrogen peroxide to react with an organic complexing agent, such that the copper surface can be readily dissolved, resulting in further increase in CMP efficiency. A preferred polishing pad is composed of polyurethane. Adequately controlled polishing conditions such as a pad rotation rate, a work load, and a coating flow of polishing solution can be adopted without particular limitations. It is preferred that the rotational rate be controlled within the range of 20 to 1,000 rpm, that the work load be controlled within the range of 100 to 500 gf/cm$^2$, and that a coating flow of the polishing solution be controlled within the range of 20 to 200 cc/min.

The CMP-processed surface with a high glossiness (hereinafter, referred to as "CMP-processed surface") is preferably a ultra-smooth surface having an arithmetic mean roughness Ra, which is determined in accordance with JIS B 0601-2001, of preferably 5.0 nm or less, more preferably 4.0 nm or less, still more preferably 3.0 nm or less, particularly preferably 2.0 nm or less, and the roughness may be appropriately determined depending on the applications, characteristics, or any other requirement for the electrodeposited copper foil. The arithmetic mean roughness Ra may have any lower limit including 0 nm, but it may be 0.5 nm in view of the efficiency of surface smoothing treatment. The arithmetic mean roughness Ra can be determined in accordance with JIS B 0601-2001 with a commercially available surface roughness meter. The electrodeposited copper foil, which has the CMP-processed surface having such an extremely small arithmetic mean roughness Ra, can further effectively prevent interelectrode short circuiting, when used as electrodes for an electronic device such as a light-emitting element and a photoelectric element.

The electrodeposited copper foil may have any thickness which allows the metal foil to retain sufficient flexibility and be handled alone as a foil, and the thickness may be appropriately determined depending on the applications, characteristics, or any other requirement for the electrodeposited copper foil. For example, when used as an electrode which also serves as a substrate for flexible electronic devices or applied to a continuous process according to a roll-to-roll process, the electrodeposited copper foil has a thickness of preferably 50 μless, more preferably 35 μm or less, and more preferably 15 μm or less. The electrodeposited copper foil having such a thickness has high flexibility. Furthermore, in view of securing the foil strength, the thickness of the electrodeposited copper foil is preferably 1 μm or more, more preferably 3 μm or more, more preferably 5 μm or more, and particularly preferably 7 μm or more. Electrodeposited copper foils having such a thickness can be cut readily with a commercially available cutter. Unlike glass substrates, the electrodeposited copper foil does not have disadvantages such as cracking and chipping, but has an advantage of barely generating particulate matter during cutting. The electrodeposited copper foil may be formed into various shapes, such as circular, triangular, and polygonal, in addition to tetragonal, and can also be cut and welded to fabricate electronic devices with a three-dimensional shape, such as a cubic shape or a spherical shape. In this case, it is preferred that an organic semiconductor layer be not formed at a cut or welded portion of the electrodeposited copper foil.

The electrodeposited copper metal of the present invention may have any length, and preferably have a length enough to be applicable to a roll-to-roll process. The length of the electrodeposited copper foil, which depends on the specifications or the like of the device, is preferably at least about 2 m, and from the viewpoint of productivity, more preferably at least 20 m, still more preferably at least 50 m, particularly preferably at least 100 m, most preferably at least 1,000 m. Furthermore, the electrodeposited copper foils may be cut into a sheet form having a predetermined size. The width of the electrodeposited copper foil which depends on the specifications or the like of the device is preferably at least about 150 mm, and from the viewpoint of productivity, more preferably at least 350 mm, still more preferably at least 600 mm, particularly preferably at least 1,000 mm. As described above, the electrodeposited copper foil of the specific embodiment of the present invention is effectively prevented from scratches which may occur during a winding operation, and thereby does not require any measures against roll scratches, for example, providing more resilient material than the electrode foil, such as a film or embossed film interposed between the front and back surfaces, resulting in simplification of handling of the electrodeposited copper foil.

The CMP-processed surface are preferably washed with an alkaline solution. A known alkaline solution, such as an ammonia-containing solution, a sodium hydroxide solution, and a potassium hydroxide solution can be used. The alkaline solution is preferably an ammonia-containing solution, more preferably an organic alkaline solution containing ammonia, most preferably a tetramethylammonium hydroxide (TMAH) solution. The preferred concentration of the TMAH solution ranges from 0.1 to 3.0 wt %. An example of the washing described above involves washing at 23° C. for one minute with a 0.4% TMAH solution. A similar washing effect can also be attained by UV (Ultra Violet) treatment in combination with or in place of the washing with the alkaline solution. Furthermore, oxides formed on the surface of, for example, copper foil can be removed with an acidic washing solution such as dilute sulfuric acid. An example of the acid washing involves washing for 30 sec with dilute sulfuric acid.

It is preferred that particles on the CMP-processed surface be removed. Examples of effective removal techniques of particles include sonic washing with ultra-pure water and dry-ice blasting. Dry-ice blasting is more effective. The dry-ice blasting involves ejecting highly compressed carbon dioxide gas through a fine nozzle and thereby squirting the ultra-smooth surface 12a with carbon dioxide solidified at low temperature to remove the particles. Unlike wet processes, the dry-ice blasting has advantages of no drying process, readily removable organic substances, or the like. The dry-ice blasting can be performed with a commercially available apparatus, such as a dry-ice snow system (manufactured by AIR WATER INC.). When the particles have been already removed by such treatment to provide a Pv/Pp ratio of 1.5 or more (e.g., the dry-ice blasting method), this particle removal process can be omitted.

Electrode Foil

Figure 2:
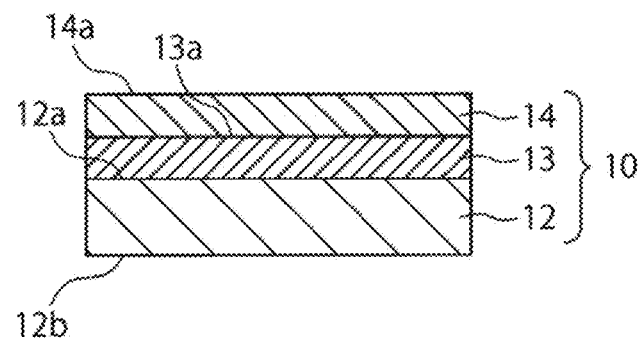
FIG. 2 is a schematic cross-sectional view illustrating an exemplary electrode foil including an electrodeposited copper foil of the present invention.

The electrodeposited copper foil of the present invention is preferably used alone or in a lamination with one or other functional layers as an electrode foil. FIG. 2 is a schematic cross-sectional view illustrating an electrode foil 10. The electrode foil 10 shown in FIG. 2 comprises an electrodeposited copper foil 12. The electrode foil 10 may optionally comprise a reflective layer 13 provided directly on the surface 12a of the electrodeposited copper foil 12, or on an antidiffusion layer provided on the surface 12a . Furthermore, the electrode foil 10 may optionally include a buffer layer 14 provided directly on the ultra-smooth surface 12a of the electrodeposited copper foil 12 or on the surface 13a of the reflective layer 13, if present. Although the electrode foil 10 shown in FIG. 2 has a triple-layer structure composed of the electrodeposited copper foil 12, the reflective layer 13, and the buffer layer 14, the electrode foil of the present invention is not limited thereto but may be a single-layer structure composed of the electrodeposited copper foil 12 or a double-layer structure composed of the electrodeposited copper foil 12 and the reflective layer 13. Alternatively, it may be a quintuple-layer structure composed of the reflective layers 13 and the buffer layers 14 provided on both sides of the electrodeposited copper foil 12.

Thus, use of the electrodeposited copper foil 12 as a supporting substrate and an electrode can provide an electrode foil which functions as both a supporting substrate and an electrode. Particularly, the electrodeposited copper foil 12 having a thickness in an appropriate range can be used as an electrode functioning as a supporting substrate for a flexible electronic device. In production of such a flexible electronic device, the electrode foil 12 of the present invention can be manufactured efficiently, for example, by a roll-to-roll process without a particular supporting substrate because the electrode foil 12 is based on electrodeposited copper foil. The roll-to-roll process is a significantly advantageous process in terms of efficient mass production of electronic devices, in which a long foil is wound off a roll, subjected to a predetermined process and rewound; therefore the roll-to-roll process is a key process to achieve mass production of electronic devices such as a light-emitting element and a photoelectric element, which belong to the application field of the present invention. Thus, the electrode foil of the present invention does not require a supporting substrate or a reflecting layer. The electrode foil of the present invention, therefore, has preferably no insulating layer at least on a portion where the electronic device is to be disposed, and more preferably no insulating layers on any portion.

The reflective layer 13 may be optionally provided directly on the surface 12a of the electrodeposited copper foil 12 or on an antireflective layer provided on the surface 12a . The reflective layer 13 is preferably composed of at least one metal or alloy selected from the group consisting of aluminum, aluminum alloys, silver, and silver alloys. These materials are suitable for a reflective layer due to high optical reflectivity and thin films formed thereof also have excellent smoothness. In particular, inexpensive aluminum or aluminum alloys are preferred. A wide variety of aluminum alloys and silver alloys having conventional alloy compositions can be used as an anode or a cathode of a light-emitting element or a photoelectric element. Preferred examples of the aluminum alloy compositions include Al—Ni; Al—Cu; Al—Ag; Al—Ce; Al—Zn; Al—B; Al—Ta; Al—Nd; Al—Si; Al—La; Al—Co; Al—Ge; Al—Fe; Al—Li; Al—Mg; Al—Mn; and Al—Ti. Any element that constitutes these alloys may be combined thereof, depending on required characteristics. Preferred examples of the silver alloy compositions include Ag—Pd; Ag—Cu; Ag—Al; Ag—Zn; Ag—Mg: Ag—Mn; Ag—Cr; Ag—Ti; Ag—Ta; Ag—Co; Ag—Si; Ag—Ge; Ag—Li; Ag—B; Ag—Pt; Ag—Fe; Ag—Nd; Ag—La; and Ag—Ce. Any element that constitutes these alloys may be combined thereof, depending on required characteristics. The reflective layer 13 can have any thickness; and preferably has 30 to 500 nm, more preferably 50 to 300 nm, and most preferably 100 to 250 nm.

The reflective layer 13, in the case of being composed of an aluminum film or an aluminum alloy film, can have a laminated structure including at least two layers. In the above embodiment, the reflective layer 13 has a laminated structure of two layers which are separated from each other by an interface, across which the lower layer and the upper layer have different crystal orientations. Thus, even if the electrode foil is exposed to a considerably high temperature, thermal migration that may occur from the interface between the copper foil and the aluminum-containing reflective layer can be effectively reduced to prevent deterioration of the surface smoothness and optical reflectivity caused by the thermal migration. That is, the thermal resistance of the electrode foil can be improved. Accordingly, the above embodiment is particularly effective in heat treatment which is performed at a temperature of 200° C. or higher, preferably 230° C. or higher, and more preferably 250° C. or higher after the hole injection layer is coated. The improved thermal resistance is probably due to blocking the thermal migration preferential in crystal boundaries by the interfaces where the crystal boundaries discontinue. The number of the interfaces in the reflective layer 13 may be two or more, which means that the reflective layer is a laminated structure of three or more layers.

The antidiffusion layer optionally provided between the electrodeposited copper foil 12 and the reflective layer 13 can be any layer that has a function of preventing diffusion of metal atoms from the electrodeposited copper foil and can employ various known compositions and structures. Thus, even if the electrode foil is exposed to a considerably high temperature, thermal migration that may occur from the interface between the copper foil and the aluminum-containing reflective layer can be effectively reduced to prevent deterioration of the surface smoothness and optical reflectivity caused by the thermal migration. That is, the heat resistance of the electrode foil can be enhanced. Accordingly, the above embodiment is particularly effective in heat treatment which is performed at a temperature of 200° C. or higher, preferably 230° C. or higher, and more preferably 250° C. or higher after the hole injection layer is coated. The antidiffusion layer may have a layer structure composed of two or more sublayers.

It is preferred that the buffer layer 14 be provided directly on the surface of at least one of the electrodeposited copper foil 12 and, if present, the reflective layer 13. In the light-emitting element or the photoelectric element, the buffer layer 14 can be any layer that can provide a desired work function after coming into contact with a semiconductor functional layer. The buffer layer in the present invention is preferably transparent or translucent to ensure a high light scattering effect.

The buffer layer 14 is preferably at least one selected from the group consisting of an conductive amorphous carbon film, an conductive oxide film, a magnesium alloy film, and a fluoride film, and may be selected as needed depending on applications such as an anode or a cathode of the electronic device and required performances.

The electrodeposited copper foil or electrode foil of the present invention can be preferably used as an electrode (i.e., anode or cathode) for various electronic devices. The electrode foil of the present invention, which can be readily bent at low stress, is particularly preferably used as an electrode for flexible electronic devices, and it may also be used for less flexible or more rigid electronic devices. Examples of the electronic devices (mainly flexible electronic devices) include i) light-emitting elements (e.g., an organic EL element, an organic EL lighting device, an organic EL display, an electronic paper display, a liquid crystal display, an inorganic EL element, an inorganic EL display, LED lighting device, and LED display; ii) photoelectric elements (e.g., a thin film solar cell); preferably an organic EL element, an organic EL lighting device, an organic EL display, an organic solar cell, and a dye-sensitized solar cell, and more preferably an organic EL lighting device because it is significantly thin and emits light of high luminance. The electrode foil of the present invention can be preferably used for an anode or a cathode of the organic solar cell because many characteristics required for the electrode of the organic solar cell are in common with those of the organic EL element. Accordingly, appropriate selection of the type of an organic semiconductor functional layer to be laminated on the electrode foil of the present invention in accordance with known techniques makes it possible to construct an organic device as any one of the organic EL element and the organic solar cell.

The both surfaces of the electrodeposited copper foil or the electrode foil of the present invention may have a high glossiness or ultra-smooth surface profile. This is advantageous for providing electronic devices on the both surfaces of the electrode foil, and thereby a double-sided functional element or a double-sided functional element foil comprising the electronic devices on the both surfaces can be provided. Furthermore, the present invention enables formation of a light-emitting element on one side and a power-generating element on the other side of the same electrode, which configuration provides a novel composite electronic device that has combined functions of the organic EL element and the organic solar cells. Furthermore, the electrode foil of the present invention can be used for not only the electrode of the organic EL element, but also a mounting substrate for the LED. In particular, the electrode foil of the present invention can be preferably used as an anode or a cathode for the LED lighting device since the LED elements can be densely mounted thereon.

Electronic Device

The electrodeposited copper foil or the electrode foil including the electrodeposited copper foil of the present invention can provide an electronic device comprising a semiconductor functional layer having semiconductive properties and provided on the light-scattering surface of the electrode foil, and preferably comprising the semiconductor functional layer provided directly on the light-scattering surface. The semiconductor functional layer may be of any material and structure having semiconductor characteristics that can exhibit the desired functions on an electrode or between the electrodes. An organic semiconductor, an inorganic semiconductor, or mixtures or combinations thereof are preferred. For example, the semiconductor functional layer preferably has a function of excited luminescence or photoexcited power generation, so that the electronic device can function as a light-emitting element or a photoelectric element. Furthermore, the light-emitting element and the photoelectric element are preferably provided with a transparent or translucent counter. electrode on the semiconductor functional layer. The process of dissolving a polymer material or a low molecular material in such a solvent as chlorobenzene and applying the solution is preferably applicable to the process of forming the semiconductor functional layer on the electrode foil of the invention, and an in-line vacuum process, which is suitable for improving productivity, is also applicable. As described above, the semiconductor functional layer may be provided on both sides of the electrode foil.

(1) Organic EL Element and Organic EL Lighting Device

A light-emitting element or an organic EL lighting device which is provided with a top-emission organic EL element on the surface can be constructed with the electrode foil of the present invention as a reflective electrode.

Figure 3:
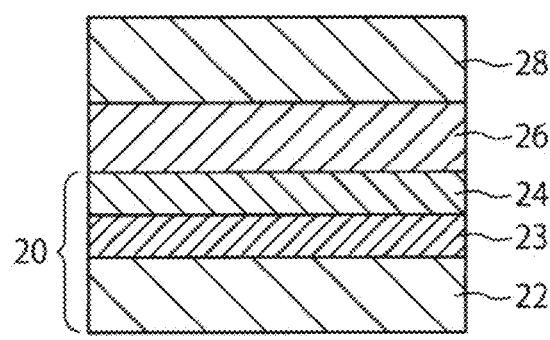
FIG. 3 is a schematic cross-sectional view illustrating an exemplary organic EL element including an anode of the electrodeposited copper foil of the present invention.

FIG. 3 shows an example layer structure of a top-emission organic EL element that includes the electrode foil of the present invention as an anode. The organic EL element depicted in FIG. 3 comprises an anodic electrode foil 20 comprising an electrodeposited copper foil 22, reflective layers 23 and optionally buffer layers 24; organic EL layers 26 provided directly on the buffer layer 24; and cathode 28 as light-transmitting electrodes provided directly on the organic EL layer 26. The buffer layer 24 is preferably composed of a conductive amorphous carbon film or a conductive oxide film suitable for an anode.

The organic EL layer 26 may have various known EL layer structures used for organic EL elements and may comprise optionally a hole injection layer and/or a hole transport layer, a light-emitting layer, and optionally an electron transport layer and/or an electron injection layer in this order from the anodic electrode foil 20 to the cathode 28. Any known structure or composition may be appropriately applied to each of the hole injection layer, the hole transport layer, the light-emitting layer, the electron transport layer, and the electron injection layer, without any particular limitation.

Figure 4:
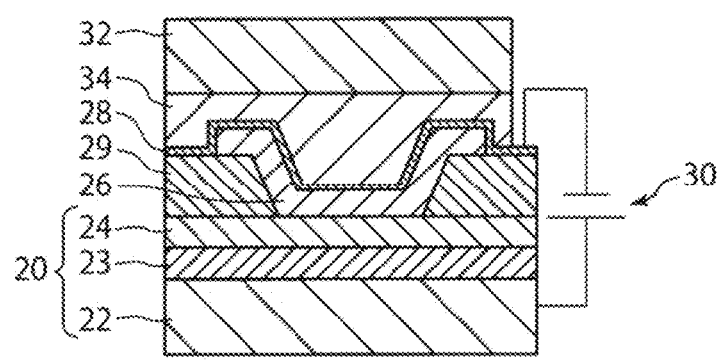
FIG. 4 is a schematic cross-sectional view illustrating an exemplary top-emission organic EL lighting device of the present invention.

FIG. 4 illustrates an example layer structure of a top-emission organic EL lighting device incorporating organic EL elements depicted in FIG. 3. In the organic EL lighting device depicted in FIG. 4, the organic EL element is electrically connectable with a power source 30 through the electrodeposited copper foil 22 of the anodic electrode foil 20. The surface area, not in contact with the organic EL layer 26, of the buffer layer 24 is covered with an interlayer insulating film 29. The interlayer insulating film 29 is preferably a Si-based insulating film, more preferably a SiN-based insulating film formed by CVD, which exhibits high barrier properties against water and oxygen that cause degradation of organic layers. A more preferred film is a SiNO-based insulating film, which has small internal stress and high flexibility.

Sealing materials 32 is disposed above the cathode 28 of the organic EL element. The gap between the sealing material 32 and the cathode 28 is filled with a sealing resin to form a sealing film 34. The sealing material 32 may be composed of a glass sheet or a film. In the case of a glass sheet, the sealing material 32 may be bonded directly onto the sealing film 34 using a hydrophobic adhesive tape. In the case of a film, both surfaces and end faces thereof may be covered with a Si-based insulating film. If a film having high barrier properties is developed in future, sealing suitable for mass production would be possible without such preliminary coating treatment. Although films having high flexibility are preferable as the sealing material 32, the required performance can be achieved with a sealing material formed of a film bonded to a significantly thin glass sheet having a thickness of 20 to 100 µm.

The cathode 28 may be composed of any of known transparent or translucent materials used in top-emission organic EL elements requiring light transmission. Materials having low work functions are preferred. Examples of the material for preferable cathodes include conductive oxide films, magnesium alloy films, and fluoride films. A combination of two or more layers of these materials is more preferred. The usable films are similar to those described for the buffer layer of the electrode foil.

A particularly preferable cathode has a double-layer laminated structure including a translucent metal layer as a buffer layer composed of a magnesium alloy film and/or a fluoride film and a transparent oxide layer as a cathode layer composed of a conductive oxide film. This structure is highly useful in terms of resistance characteristics. In this case, a high optical transparency and a low work function can be provided by bringing the translucent metal layer (buffer layer) of the cathode 28 into contact with the organic EL layer 26, resulting in enhanced brightness and power efficiency of the organic EL element. The most preferred example is a laminated cathode structure of a transparent oxide layer (cathode layer) composed of indium zinc oxide (IZO) and a translucent metal layer (buffer layer) composed of Mg—Ag. Furthermore, the cathode structure may have two or more transparent oxide layers and/or two or more translucent metal layers. Thus, the light generated in the organic EL layer 26 passes through the cathode 28, the sealing film 34, and then the sealing material 32 to be emitted to the outside.

On the back surface of the electrode foil 20, an auxiliary substrate may be appropriately provided depending on the type of application. Since this portion does not affect light emission performance, any material may be selected with a high degree of freedom. For instance, a flexible resin film, such as poly(ethylene terephthalate) (PET), polyimide (PI), polycarbonate (PC), polyethersulfone (PES), and polyethernitrile (PEN), can be appropriately used.

Figure 5:
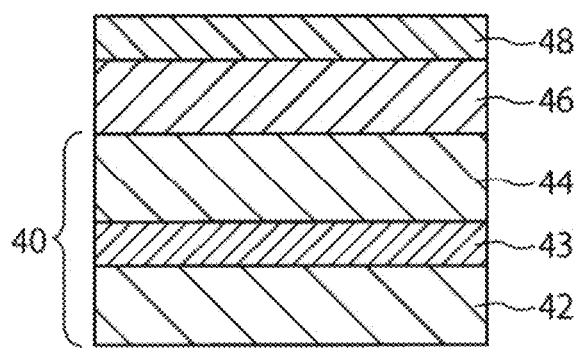
FIG. 5 is a schematic cross-sectional view illustrating an exemplary organic EL element including a cathode of the electrodeposited copper foil of the present invention.

FIG. 5 illustrates an example layer structure of a top-emission organic EL element including the electrode foil of the present invention as a cathode. The organic EL element depicted in FIG. 5 includes a cathodic electrode foil 40 comprising an electrodeposited copper foil 42, reflective layers 43 and buffer layers 44; organic EL layers 46 provided directly on the buffer layer 44; and anodes 48 as counter electrodes provided directly on the organic EL layer 46. The organic EL layer 46 may have a configuration similar to the organic EL layer 26 depicted in FIG. 3. The buffer layer 44 may also have a configuration similar to the cathode 28 depicted in FIG. 3, and preferably composed of a conductive oxide film, a magnesium alloy film, a fluoride film, or a combination of two or more thereof. More preferably, the buffer layer 44 is a translucent metal layer composed of a magnesium alloy film end/ora fluoride film.

More specifically, the organic EL element including the cathodic electrode foil 40 depicted in FIG. 5 corresponds to a structure of the organic EL element including the anodic electrode foil 20 depicted in FIG. 3, except that the buffer layers 24 and the cathodes 28 are interchanged, respectively, and the order of the layers from the anodes inside the organic EL layer 26 to the cathodes is inverted. In a preferred embodiment, a magnesium alloy film or a fluoride film as the buffer layer 44 of the cathodic electrode foil 40 is formed by sputtering or vapor deposition while a film composed of conductive amorphous carbon, $MoO_3$, or $V_2O_5$ as the anode 48 is formed by vapor deposition. In particular, a conductive amorphous carbon film is preferably formed on the organic EL layer by vacuum deposition to avoid plasma damaging during sputtering.

(2) Photoelectric Element

A photoelectric elements may be formed on the surface of the electrode foil of the present invention as a reflective electrode. The photoelectric element according to a preferable embodiment of the present invention includes an electrode foil, a photoexcitation layer as a semiconductor functional layer provided directly on the surface of the electrode foil, and a light-transmitting counter electrode provided directly on the surface of the photoexcitation layer. The photoexcitation layer may have various structures and may be composed of materials which are known as semiconductor functional layers of photoelectric elements.

For example, the organic EL layer 26 depicted in FIG. 3 may be replaced with a known organic solar cell active layer to construct an organic solar cell. The organic solar cell including the electrode foil of the present invention as an anode can be disposed on a buffer layer (e.g., a carbon buffer layer) by depositing a hole transport layer (PEDOT:PSS (30 nm)), a p-type organic semiconductor functional layer (e.g., BP (benzoporphyrin)), on i-type mixing layer (e.g., BP:P-CBNB (fullerene derivative) of an n-type organic semiconductor and a p-type organic semiconductor, an n-type organic semiconductor layer (e.g., PCBM (fullerene derivative)), a buffer layer having a low work function (e.g., Mg—Ag), and a transparent electrode layer (e.g., IZO) in this order. Furthermore, in another example, the electrodeposited copper foil (e.g., a copper foil) has a reflective layer (e.g., an aluminum film) and an n-type semiconductor buffer layer (e.g., an n-type oxide semiconductor such as ZnO, $SnO_2$, $TiO_2$, NbO, $In_2O_3$, $Ga_2O_3$ and combinations thereof), and the solar cell may be constructed by laminating a blend layer (e.g., P3HT:PCBM) of a p-type organic semiconductor and an n-type organic semiconductor, a hole transport layer (e.g., PEDOT:PSS) and an electrode in this order, on the n-type semiconductor buffer layer. Known materials may be appropriately used for these layers without any particular limitation. The electrode used for organic solar cells may be composed of the same materials and may have the same structures as an electrode used for organic EL elements. The electrode foil of the present invention comprises a reflective layer, which will increase the power generation efficiency by light confinement due to cavity effect.

The photoexcitation layer is composed of various known functional sublayers. These sublayers may be laminated from the electrode foil to the counter electrode in order. Alternatively, a first laminated portion of the electrode foil side and a second laminated portion of the counter electrode side may be separately prepared and then the first and the second laminated parts are bonded together to produce a photoelectric element including a desired photoexcitation layer.

EXAMPLES

The present invention will be further described in detail with reference to the following examples.

Example 1

{100}-Oriented Copper Foil (1) Preparation of Untreated Electrodeposited Copper Foil Aqueous sulfuric acid based aqueous copper sulfate solution containing 140 /L. of sulfuric acid and 80 g/L of copper was prepared. The aqueous solution was used to prepare an electrolytic solution containing bis(3-sulfopropyl)disulfide (5 ppm), a polymer of a quaternary ammonium salt having a cyclic structure (Senka Co., Unisence: FPA100L) (3 ppm), polyethylene glycol having a molecular weight of 1,000 (10 ppm), and chlorine (20 ppm). The electrodeposition was performed with the electrolytic solution at a liquid temperature of 60° C. at an electrolytic current density of 75 $Ndm^2$ to prepare an electrodeposited copper foil having a thickness of 35 μm. The arithmetic average roughness Ra of the surface (deposition surface) of the resulting electrodeposited copper foil, which was measured with a scanning probe microscope (Nano Scope V, manufactured by Veeco Instrument Inc.) in accordance with JIS B 0601-2001, was 66.4 nm. This measurement was performed in an area of 10 μm square using a Tapping Mode AFM.

(2) CMP Process

A rubber pad having a thickness of 0.5 mm out into a 10 cm square piece was attached to a stainless steel jig with a double-sided tape. The resulting total stainless steel pad weighed 20 kg. Meantime, the untreated electrodeposited copper foil previously prepared had been cut into an 11.5 mm square piece slightly larger than the rubber pad. The rubber pad was held down by a stainless steel jig so as to be attached to the center of the out electrodeposited copper foil. The surface (deposition surface) was CMP-processed with a polishing machine manufactured by MAT Inc. This CMP process was performed with a polishing pad having XY grooves and a colloidal silica polishing solution under the conditions of a pad rotation rate of 30 rpm; a load of 200 $gf/cm^2$; and a liquid supply rate of 100 cc/min. Colloidal silica based polishing solution was used, containing colloidal silica (particle size: 50 nm to 100 nm) (5 wt %), glycine (1 wt %), hydrogen peroxide (3 wt %), water (90.9 wt %), and benzotriazole (BTA) (0.1 wt %). One minute after the initiation of the CMP process, the polishing was stopped and the arithmetic mean roughness Ra of the surface of the metal copper foil was measured under the same conditions described above. The rate of reduction in the arithmetic mean roughness Ra by one minute of CMP processing was calculated to be 62.9 nm/min.

(3) Measurement of Rate of {100} Orientation

Figure 6:
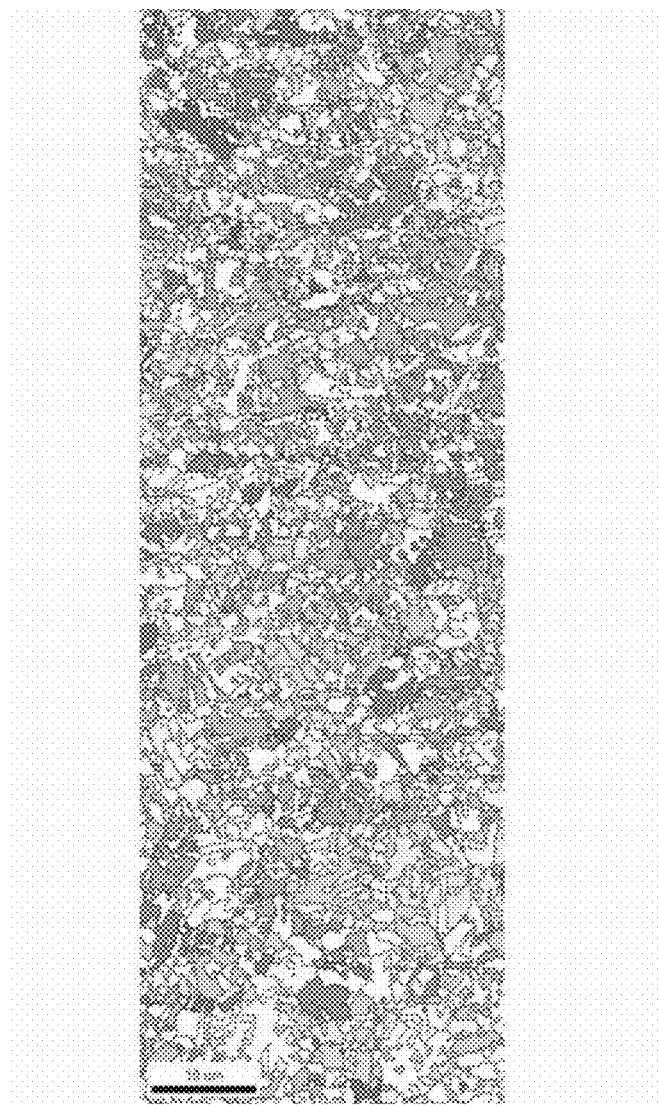
FIG. 6 is a crystal orientation map ({100}, ND direction) obtained from the EBSD measurements on the surface of the electrodeposited copper foil prepared in Example 1. The gray-colored areas are occupied by the {100} planes deviating by 30° or less from the <001> crystal orientation.
Figure 13:
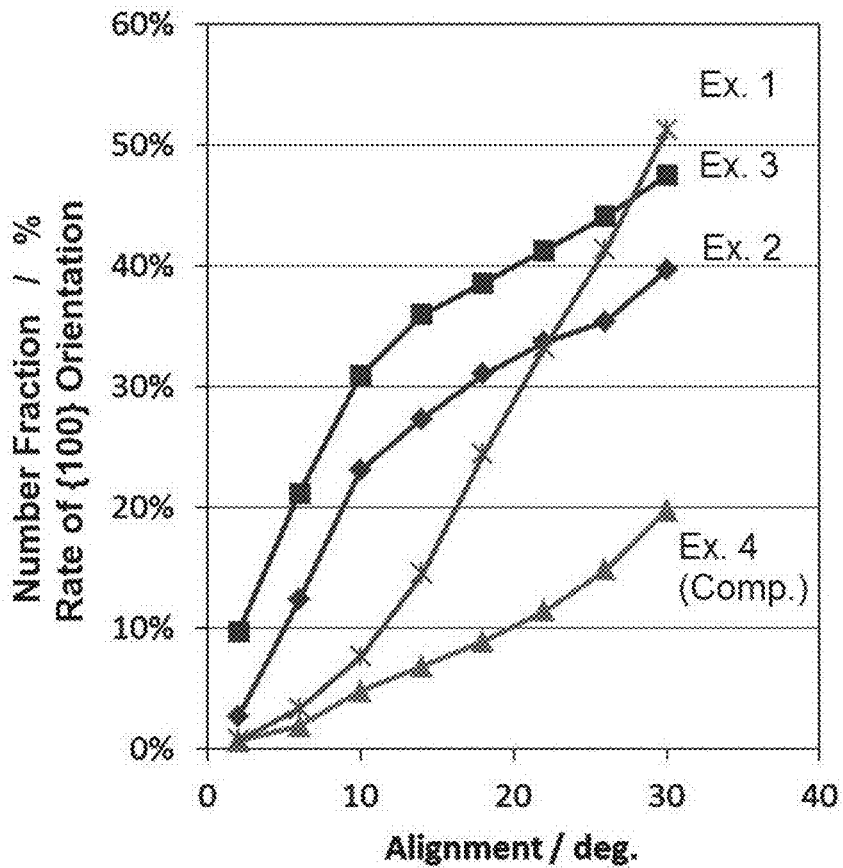
FIG. 13 is a graph plotting fractions of the areas occupied by the {100} planes deviating by 2° or less, 6° or less, 10° or less, 14° or less, 18' or less, 22° or less, 26° or less, and 30° or less from the <001> crystal orientation (rate of {100} orientation) measured in Examples 1 to 4.

The CMP-processed surface of the electrodeposited copper foil was observed with an electron backscatter diffractometer (EBSD, TSL Solutions K.K., product name: Pegasus system, accelerating voltage: 20 kV, aperture diameter: 60 μm, high-current mode, current: 3 nA, measuring range: 35 μm×105 μm, step width: 0.3 μm) mounted on a field emission electron microscope (FE-SEM, Carl Zeiss, Inc., product name: SUPRA55AP). Fractions of the areas occupied by the {100} planes deviating by 2° or less, 6° or less, 10° or less, 14° or less, 18° or less, 22° or less, 26° or less, and 30° or less from the <001> crystal orientation (hereinafter referred to as "rate of {100} orientation") each were calculated by image analysis. The results are shown in FIG. 13. The fraction of the areas occupied by the {100} plane deviating by 18° or less from the <001> crystal orientation was 24.38%. The crystal orientation map ({100}. ND direction) of the surface of the electrodeposited copper foil obtained by EBSD is shown FIG. 6. In the crystal orientation map of FIG. 6, the areas of the crystals occupied by the {100} planes deviating by 30° or less from the <001> crystal orientation are gray-colored; the darker gray indicates the presence of the {100} plane less deviating from the <001> crystal orientation.

Figure 7:
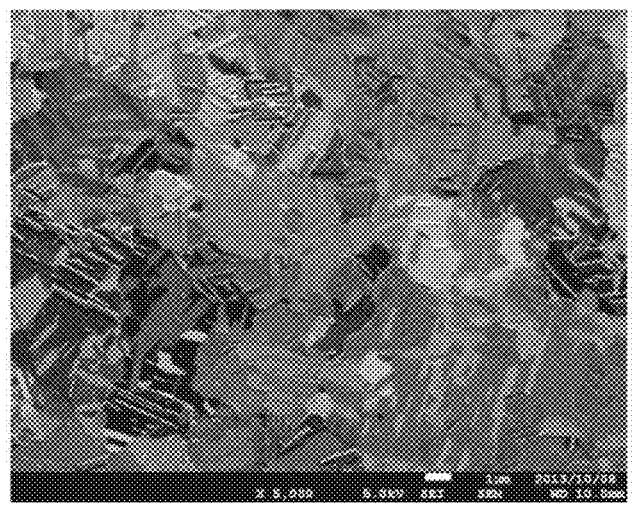
FIG. 7 is a SEM photograph of the surface of the electrodeposited copper foil after etching treatment with glycine and hydrogen peroxide solution in Example 1.

The surface of the electrodeposited copper foil was etched with 3 vol % hydrogen peroxide solution containing 2.7 g/l of glycine on the basis of the total organic carbon (TOC) concentration. The {100} plane is etched with this etching solution more readily than any other crystal plane such as the (111) plane which tends to remain unetched. As shown in FIG. 7, it was found from the actual observation of the surface of the copper foil after etching that only small areas were unetched, demonstrating that the fraction of these areas occupied by the readily etched {100} plane of the copper surface was high.

(4) Measurement of glossiness $G_s$ (20°)

The glossiness $G_s$ (20°) of the CMP-processed surface of the electrodeposited copper foil was measured using a handy glossiness meter (PG-II/IIM, Nippon Denshoku Industries Co., Ltd.) in accordance with JIS Z 8741-1997. The resulting glossiness $G_s$ (20°) of the CMP-processed surface of the electrodeposited copper foil was 1,607. In the measurement of the glossiness, as necessary, a calibration was performed from time to time with reference to a standard glossiness plate (black), and then a sub-standard glossiness plate (white) was measured in a similar way to confirm the difference within 2.0 or less from the reference value.

Example 2

{100}-oriented Copper Foil

Figure 8:
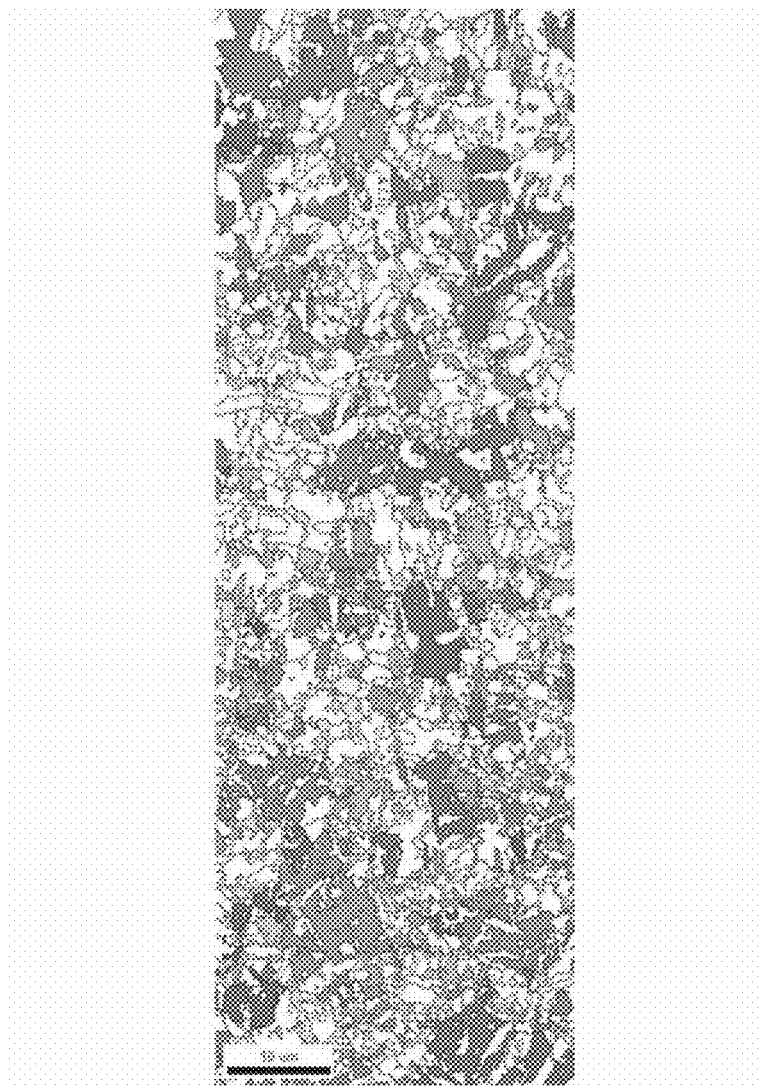
FIG. 8 is a crystal orientation map ({100}. ND direction) obtained from the EBSD measurements on the surface of the electrodeposited copper foil prepared in Example 2. The gray-colored areas are occupied by the {100} planes deviating by 30° or less from the <001> crystal orientation.

Aqueous sulfuric acid based aqueous copper sulfate solution containing 140 g/L of sulfuric acid and 80 g/L of copper was prepared. The aqueous solution was used to prepare an electrolytic solution containing bis(3-sulfopropyl)disulfide (5 ppm), polyethylene glycol having a molecular weight of 3,000 (50 ppm), and chlorine (30 ppm). The electrodeposition was performed with the electrolytic solution at a liquid temperature of 60° C. at an electrolytic current density of 60 Ndm² to prepare an electrodeposited copper foil having a thickness of 35 μm. The surface roughness Ra of the deposition surface of the resulting electrodeposited copper foil was measured as in Example 1 to be 53.6 nm. The surface (deposition surface) of the electrodeposited copper foil was CMP-processed as in Example 1. During the CMP process, polishing was stopped at the lapse times of 30 sec, 1 min, 2 min, 3 min, 4 min, and 5 min to determine the arithmetic mean roughnesses (Ra) of the metal copper foil surface in the same conditions described above. The surface roughness Ra after each lapse time was shown in FIG. 14. The rate of reduction in the arithmetic mean roughness Ra by one minute of CMP processing was calculated to be 50.4 nm/min. The rate of {100} orientation was determined as in Example 1 and was shown in FIGS. 8 and 13. The fraction of the areas occupied by the {100} plane deviating by 18° or less from the <001> crystal orientation was 30.98% The glossiness $G_s$ (20°) of the surface of the electrodeposited copper foil which was CMP-processed as in Example 1 was determined to be 1,635.

Example 3

{100}-oriented Copper Foil

Figure 9:
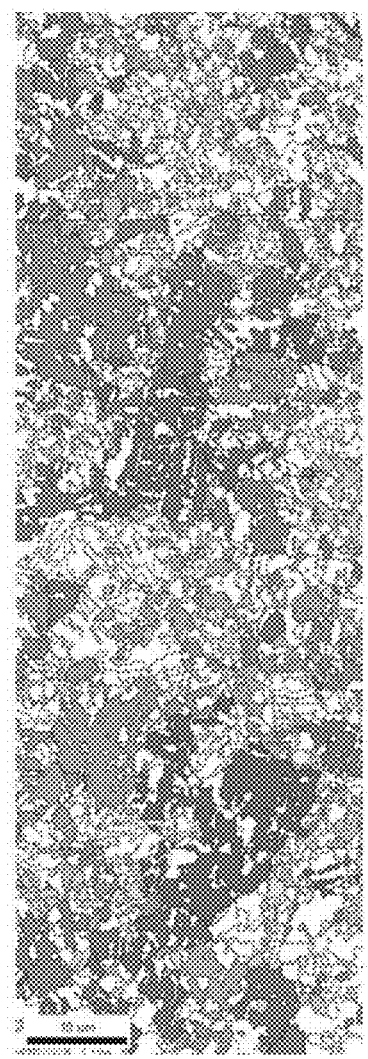
FIG. 9 is a crystal orientation map ({100}, ND direction) obtained from the EBSD measurements on the surface of the electrodeposited copper foil prepared in Example 3. The gray-colored areas are occupied by the {100} planes deviating by 30° or less from the <001> crystal orientation.
Figure 10:
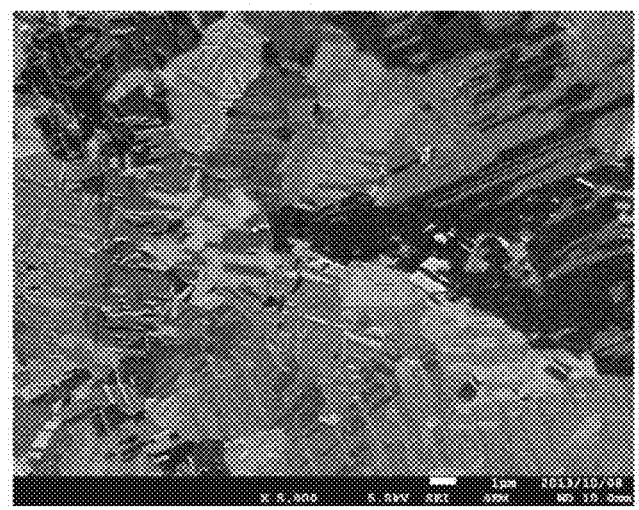
FIG. 10 is a SEM photograph of the surface of the electrodeposited copper foil after etching treatment with glycine and hydrogen peroxide solution in Example 3.

Aqueous sulfuric acid based aqueous copper sulfate solution containing 140 g/L of sulfuric acid and 80 g/L of copper was prepared. The aqueous solution was used to prepare an electrolytic solution containing bis(3-sulfopropyl)disulfide (5 ppm), polyethylene glycol having a molecular weight of 6,000 (20 ppm), and chlorine (30 ppm). The electrodeposition is performed with the electrolytic solution at a liquid temperature of 60° C. at an electrolytic current density of 60 Ndm² to prepare an electrodeposited copper foil having a thickness of 35 μm. The surface roughness Ra of the deposition surface of the resulting electrodeposited copper foil was measured as Example 1 to be 64.7 nm. The surface (deposition surface) of the electrodeposited copper foil was CMP-processed as in Example 1. During the CMP process, polishing was stopped at the lapse times of 30 sec, 1 min, 2 min, 3 min, 4 min, and 5 min to determine the arithmetic mean roughness Ras of the metal copper foil surface in the same conditions described above. The surface roughness Ra after each lapse time was shown in FIG. 14. The rate of reduction in the arithmetic mean roughness Ra by one minute of CMP processing was calculated to be 61.8 nm/min. The rate of {100} orientation was determined as in Example 1 to obtain the results shown in FIGS. 9, 10, and 13. The fraction of the areas occupied by the {100} plane deviating by 18° or less from the <001> crystal orientation was 38.54%. The glossiness $G_s$ (20°) of the surface of the electrodeposited copper foil which was CMP-processed as in Example 1 was determined to be 1,665.

Example 4 (Comparative)

(111)-oriented Copper Foil

Figure 11:
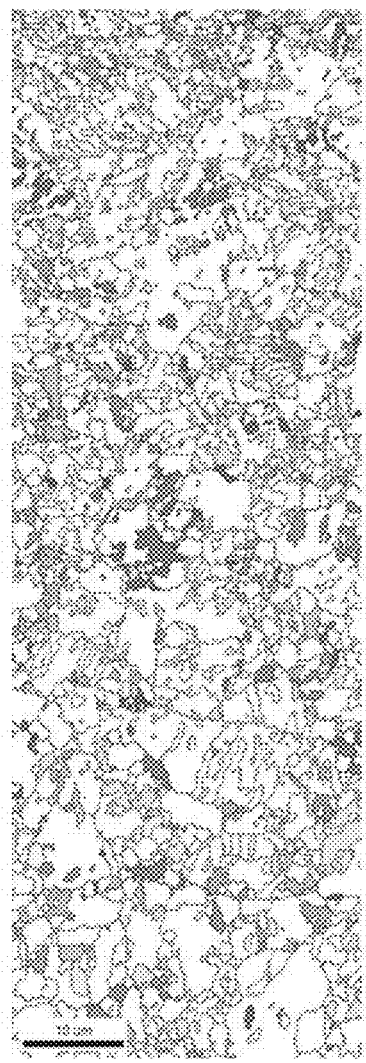
FIG. 11 is a crystal orientation map ({100}. ND direction) obtained from the EBSD measurements on the surface of the electrodeposited copper foil prepared in Example 4 (Comparative). The gray-colored areas are occupied by the {100} planes deviating by 30° or less from the <001> crystal orientation.
Figure 12:
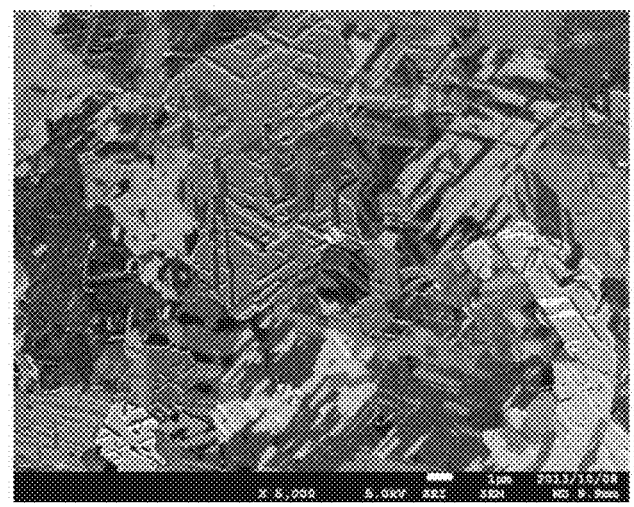
FIG. 12 is a SEM photograph of the surface of the electrodeposited copper foil after etching treatment with glycine and hydrogen peroxide solution in Example 4 (Comparative).

Aqueous sulfuric acid based aqueous copper sulfate solution containing 140 g/L of sulfuric acid and 80 g/L of copper was prepared. The aqueous solution was used to prepare an electrolytic solution containing bis(3-sulfopropyl)disulfide (5 ppm), a polymer of a quaternary ammonium salt having a cyclic structure (Senka Co., Unisence: FPA100L) (40 ppm), and chlorine (30 ppm). The electrodeposition was performed with the electrolytic solution at a liquid temperature of 60° C. at an electrolytic current density of 75 Ndm² to prepare an electrodeposited copper foil having a thickness of 35 μm. The surface roughness Ra of the deposition surface of the resulting electrodeposited copper foil was measured as in Example 1 to be 25.6 nm. The surface (deposition surface) of the electrodeposited copper foil was CMP-processed as in Example 1. During the CMP process, polishing was stopped at lapse times of 30 sec, 1 min, 2 min, 3 min, 4 min, and 5 min to determine the arithmetic mean roughness Ras of the metal copper foil surface in the same conditions described above. The surface roughness Ra after each lapse time was shown in FIG. 14. The rate of reduction in the arithmetic mean roughness Ra by one minute of CMP processing was calculated to be 25.6 nm/min. The rate of <001> orientation was determined as in Example 1 to obtain the results shown in FIGS. 11 to 13. In the electrodeposited copper foil of the present example, the fraction of the areas occupied by the {100} plane deviating by 18° or less from the <001> crystal orientation was as low as 8.88%, and the fraction of the gray-colored areas occupied by the {100} plane deviating by 30° or less from the <001> crystal orientation was low also in the crystalline map shown in FIG. 11. As shown in FIG. 12, the large areas remaining unetched demonstrates that the fraction of the areas occupied by the readily etched {100} plane was low on the surface of the copper foil surface. The glossiness $G_s$ (20°) of the surface of the electrodeposited copper foil which was CMP-processed for one minute as in Example 1 was slightly low as 1,477.

Result

Figure 14:
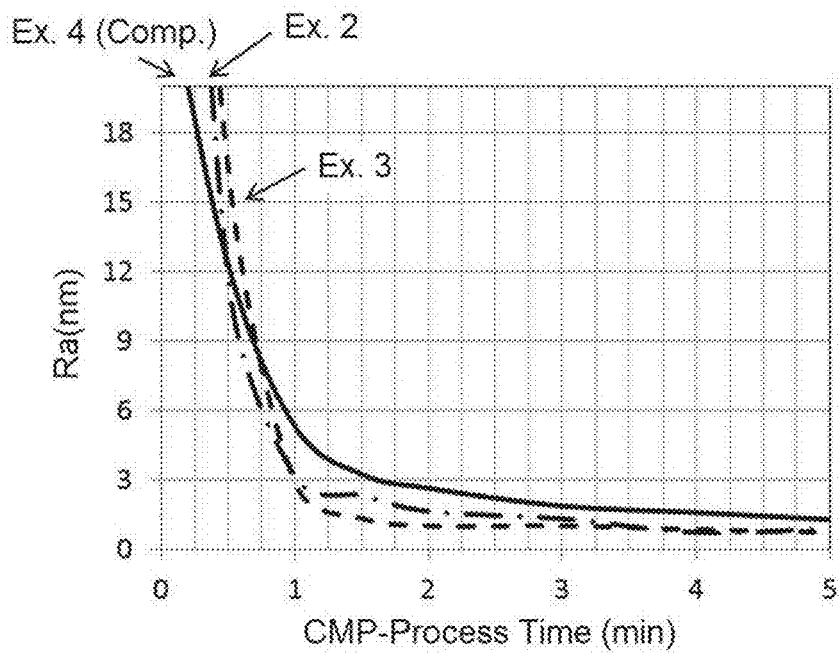
FIG. 14 is a graph illustrating relationships between surface roughnesses (Ra) and CMP-process times measured in Examples 2 to 4.
Figure 15:
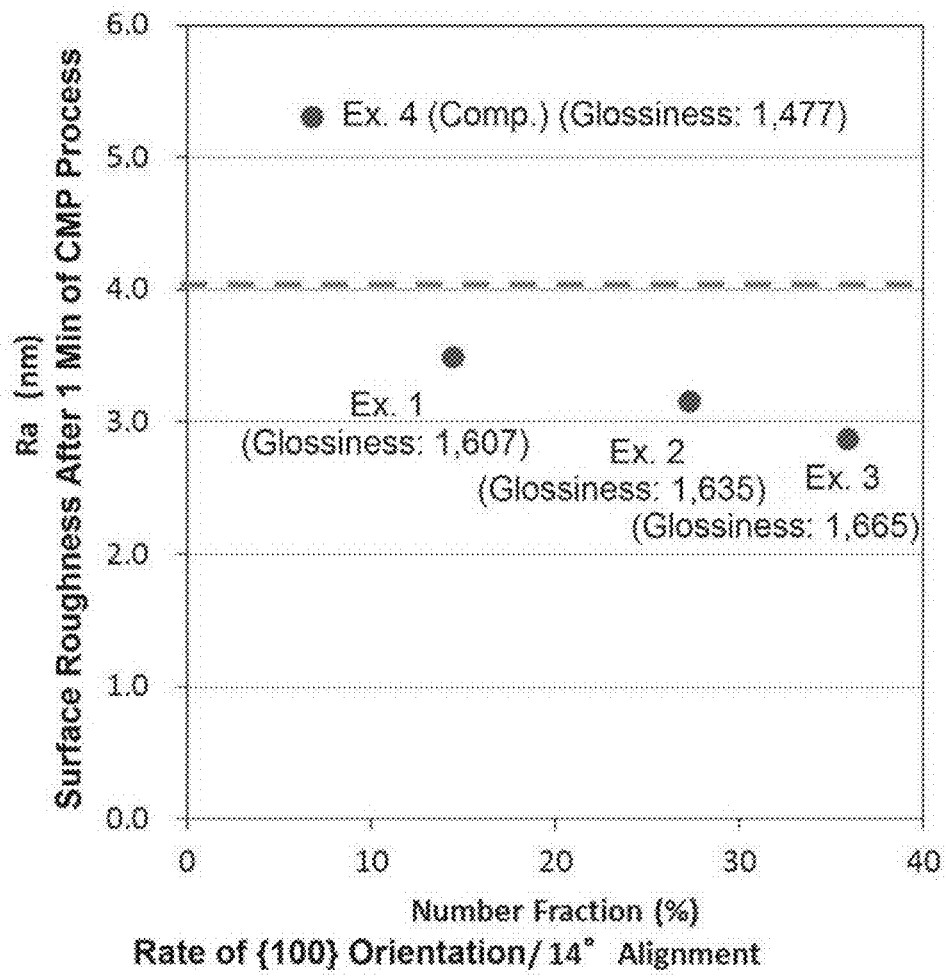
FIG. 15 is a graph plotting a relationship between fractions of the areas occupied by the {100} plane deviating by 14° or less from the <001> crystal orientation (rate of {100} orientation) measured in Examples 1 to 4 and surface roughnesses (Ra) after one minute of CMP processing.

As demonstrated in the results shown in FIGS. 14 and 15, the use of the high metal foil having a high rate of {100} orientation allows high quality electrodeposited copper foil with high glossiness to be produced in a short time by a CMP process. The high glossiness reduces the angle dependence of cavities; such an effect is enhanced in the case of a white emission. Due to the dependence of the polishing rate on the type of the crystal plane, the surface of an electrodeposited copper foil having higher rate of {100} orientation is polished into a mirror surface in a shorter time, and therefore suitable for a roll-to-roll process, resulting in efficient manufacturing of a high gloss copper foil roll.

The invention claimed is:
1. An electrodeposited copper foil comprising areas occupied by the {100} plane deviating by 18° or less from the <001> crystal orientation; wherein the fraction of the foil having the areas is 10% or more of the foil determined by analysis of the surface by electron backscatter diffraction (EBSD),
    wherein at least one surface of the electrodeposited copper foil has a glossiness Gs) (20°)of 1,500 or more, determined in accordance with JIS Z 8741-1997.
2. The electrodeposited copper foil according to claim 1, wherein the glossiness Gs) (20°) is 1,600 or more.
3. The electrodeposited copper foil according to claim 1, wherein the at least one surface has an arithmetic mean roughness Ra of 5.0 nm or less, determined in accordance with JIS B 0601-2001.
4. The electrodeposited copper foil according to claim 1, having a thickness of 50 μm or less.

5. An electronic device comprising:
an electrode foil including the electrodeposited copper foil according to claim 1;
a semiconductor functional layer having semiconductive properties and disposed on the surface of the electrode foil; and
a counter electrode layer disposed on the semiconductor functional layer.

6. The electronic device according to claim 5, wherein the semiconductor functional layer has a function of excited luminescence or photoexcited power generation, and thereby the electronic device functions as a light-emitting element or a photoelectric element.

\* \* \* \* \*